(12) United States Patent
Lin et al.

(10) Patent No.: US 9,613,819 B2
(45) Date of Patent: Apr. 4, 2017

(54) PROCESS CHAMBER, METHOD OF PREPARING A PROCESS CHAMBER, AND METHOD OF OPERATING A PROCESS CHAMBER

(71) Applicant: Taiwan Semiconductor Manufacturing Company, Ltd., Hsin-Chu (TW)

(72) Inventors: Yu Chao Lin, Hsin-Chu (TW); Ming-Ching Chang, Hsin-Chu (TW); Yuan-Sheng Huang, Taichung (TW); Jui-Ming Chen, Zhunan Township (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 24 days.

(21) Appl. No.: 14/297,918

(22) Filed: Jun. 6, 2014

(65) Prior Publication Data

US 2015/0357164 A1    Dec. 10, 2015

(51) Int. Cl.
| | |
|---|---|
| H01L 21/461 | (2006.01) |
| H01L 21/3065 | (2006.01) |
| H01J 37/32 | (2006.01) |
| C23C 16/40 | (2006.01) |
| C23C 16/509 | (2006.01) |

(52) U.S. Cl.
CPC .......... *H01L 21/3065* (2013.01); *C23C 16/40* (2013.01); *C23C 16/401* (2013.01); *C23C 16/509* (2013.01); *H01J 37/32467* (2013.01); *H01J 37/32477* (2013.01); *H01J 37/32853* (2013.01); *H01J 37/32871* (2013.01); *H01J 2237/334* (2013.01)

(58) Field of Classification Search
CPC ............... H01J 37/321; H01J 37/32082; H01J 37/32862; H01J 37/32192; H01J 2237/334; C23C 16/4405; C23C 16/4404; C23C 16/402; C23C 16/52; C23C 14/54; C23C 16/045; C23C 14/046; C23C 14/358; C23C 16/44; C23C 16/4401; C23C 16/342; C23C 16/38
USPC ........ 216/67, 37, 41, 76; 438/710, 694, 722, 438/905; 427/107, 167, 248.1, 255.18, 427/255.38
See application file for complete search history.

(56) References Cited

U.S. PATENT DOCUMENTS

| | | | |
|---|---|---|---|
| 6,121,161 A * | 9/2000 | Rossman .............. | C23C 14/564 438/783 |
| 6,350,697 B1 * | 2/2002 | Richardson et al. ......... | 438/710 |
| 6,830,622 B2 * | 12/2004 | O'Donnell ........... | B01J 19/0073 118/715 |
| 7,204,913 B1 * | 4/2007 | Singh et al. ............. | 156/345.51 |

(Continued)

*Primary Examiner* — Nadine Norton
*Assistant Examiner* — Christopher Remavege
(74) *Attorney, Agent, or Firm* — Slater Matsil, LLP

(57) ABSTRACT

Process chambers and methods of preparing and operating a process chamber are disclosed. In some embodiments, a method of preparing a process chamber for processing a substrate includes: forming a first barrier layer over an element disposed within a cavity of the process chamber, the element comprising an outgassing material; and forming, within the process chamber, a second barrier layer over the first barrier layer.

20 Claims, 12 Drawing Sheets

(56) References Cited

U.S. PATENT DOCUMENTS

| | | | | |
|---|---|---|---|---|
| 2008/0216958 A1* | 9/2008 | Goto | ............... | C23C 16/4404 |
| | | | | 156/345.35 |
| 2008/0286982 A1* | 11/2008 | Li | ............... | H01J 37/32412 |
| | | | | 438/782 |
| 2008/0292798 A1* | 11/2008 | Huh | ............... | C23C 16/342 |
| | | | | 427/343 |
| 2010/0112822 A1* | 5/2010 | Toratani | ............... | C23C 16/0272 |
| | | | | 438/758 |
| 2010/0119843 A1* | 5/2010 | Sun | ............... | H01J 37/32477 |
| | | | | 428/426 |
| 2010/0267224 A1* | 10/2010 | Choi | ............... | H01J 37/32412 |
| | | | | 438/513 |
| 2011/0146909 A1* | 6/2011 | Shih et al. | ............... | 156/345.35 |

* cited by examiner

PROCESS CHAMBER, METHOD OF PREPARING A PROCESS CHAMBER, AND METHOD OF OPERATING A PROCESS CHAMBER

BACKGROUND

Process chambers are often used for semiconductor processing. A substrate may be placed within a process chamber and subsequently subjected to various semiconductor processing steps, such as deposition, etching, patterning, and annealing, as examples.

As semiconductor devices are being scaled down to critical dimensions of 65 nm and below, strict control of conditions within the process chamber is important to achieving consistent etch rates, deposition rates, etch depths, critical dimensions, etch profiles, and metal gate resistances from one substrate to the next.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
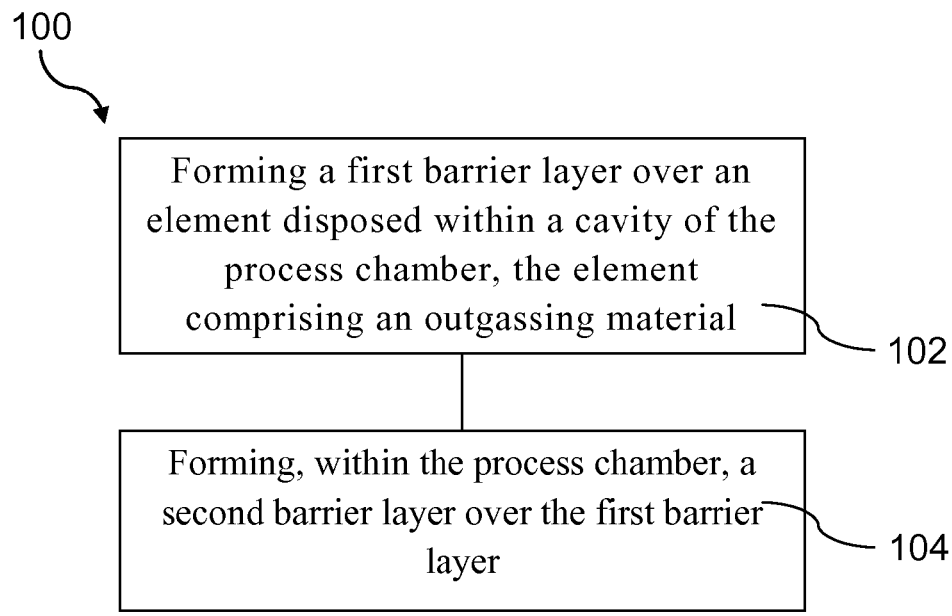
FIG. 1A and FIG. 1B show methods of preparing a process chamber for processing a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a method 100 of preparing a process chamber for processing a substrate, in accordance with one or more embodiments. The method 100 may include: forming a first barrier layer over an element disposed within a cavity of the process chamber, the element comprising an outgassing material (in 102); and forming, within the process chamber, a second barrier layer over the first barrier layer (in 104).

Figure 1B:
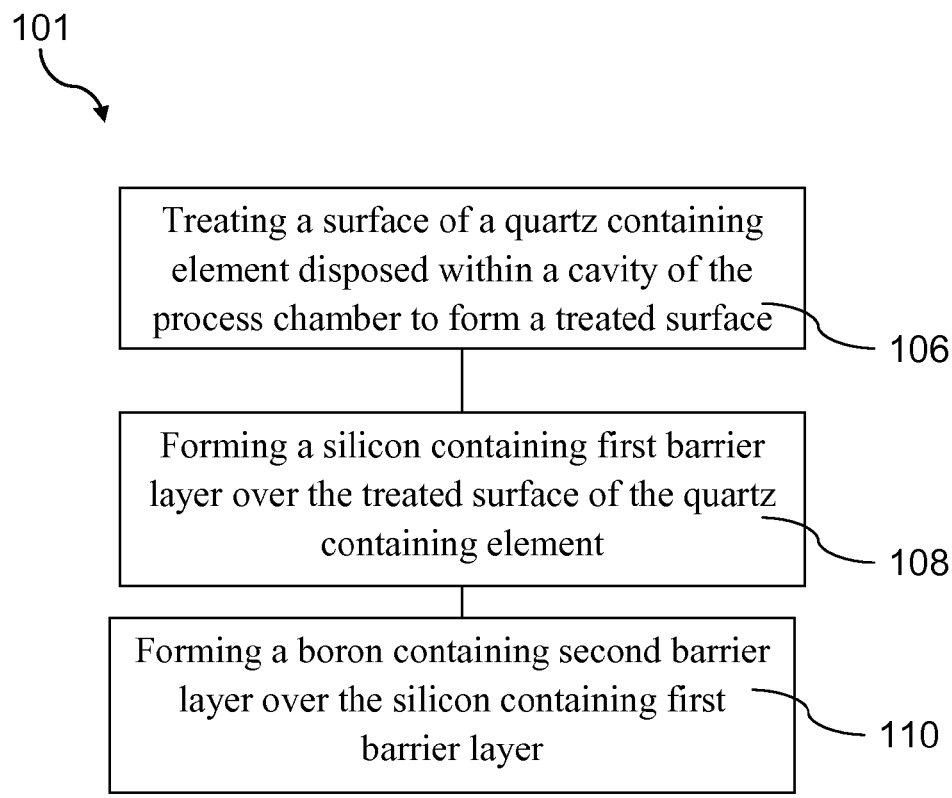

FIG. 1B shows a method 101 of preparing a process chamber for processing a substrate, in accordance with one or more embodiments. The method 101 may include: treating a surface of a quartz containing element disposed within a cavity of the process chamber to form a treated surface (in 106); forming a silicon containing first barrier layer over the treated surface of the quartz containing element (in 108); and forming a boron containing second barrier layer over the silicon containing first barrier layer (in 110).

FIG. 2A to FIG. 2F show a process flow illustrating some of the process steps of the method 100 shown in FIG. 1A and the method 101 shown in FIG. 1B, in accordance with one or more embodiments. The process steps illustrated in FIG. 2A to FIG. 2F may occur prior to introducing a substrate (e.g. a wafer) into a process chamber, as an example.

Figure 2A:
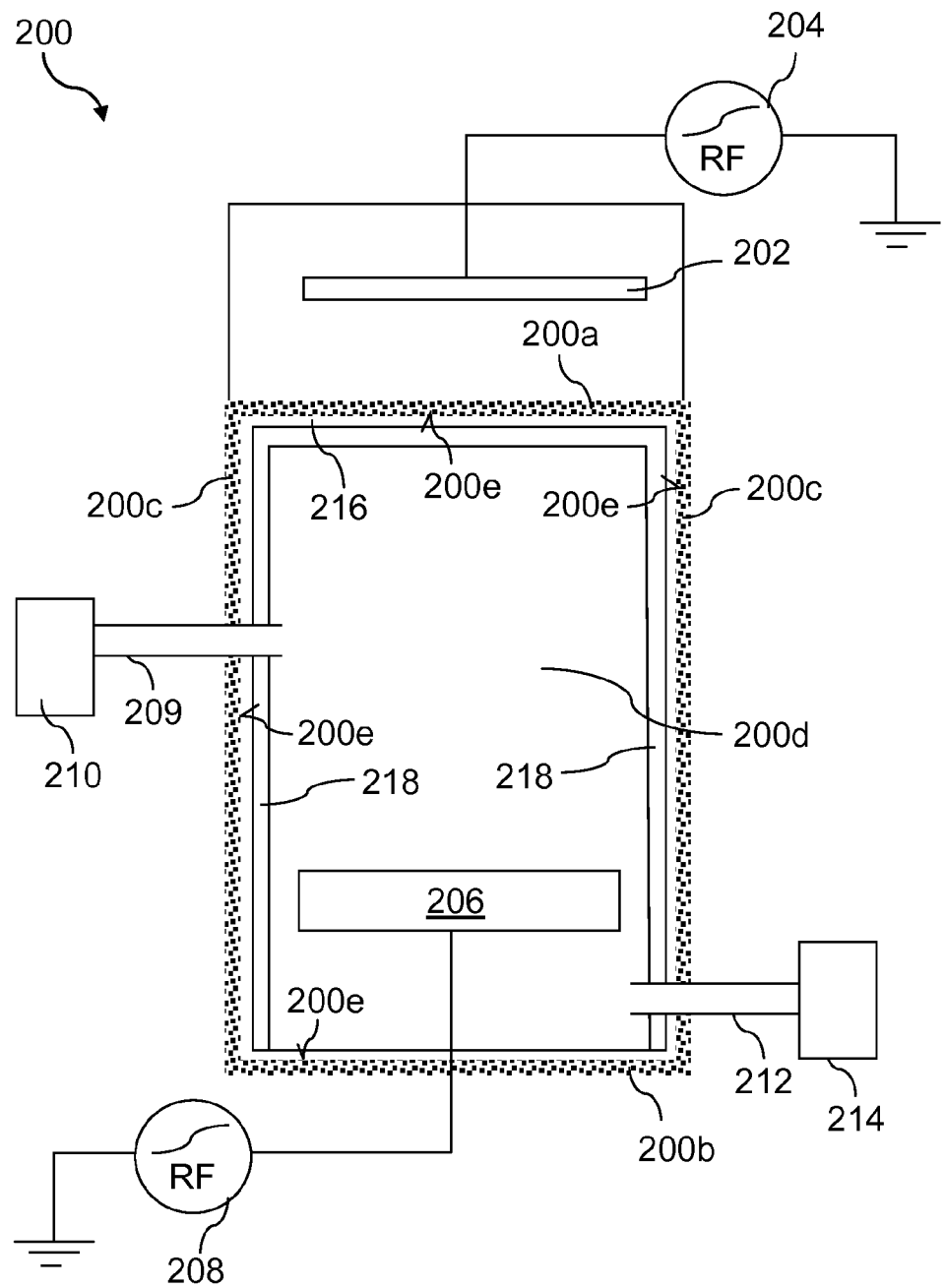
FIG. 2A to FIG. 2F show a process flow illustrating some of the process steps of the method shown in FIG. 1A and the method shown in FIG. 1B, in accordance with some embodiments.

FIG. 2A shows a cross-sectional schematic view of a process chamber 200, in accordance with one or more embodiments. The process chamber 200 may be an apparatus used in semiconductor processing. As an example, the process chamber 200 may be used in semiconductor device manufacturing to etch such materials as semiconductors, metals and dielectrics. The process chamber 200 is defined by a top 200a, a base 200b, and sidewalls 200c that extend between the top 200a and the base 200b. The top 200a, the base 200b, and the sidewalls 200c of the process chamber 200 may enclose a cavity 200d within the process chamber 200. Surfaces of the top 200a, the base 200b, and the sidewalls 200c that face the cavity 200d may be referred to as an inner surface 200e of the process chamber 200. In an embodiment, the process chamber 200 may include, or may consist of, an electrically and/or thermally conductive material. As an example, the top 200a, the base 200b, and the sidewalls 200c of the process chamber 200 may include, or may consist of, a metal or metal alloy, examples of which include aluminum.

The process chamber 200 may include an electrode 202 disposed above the top 200a that provides energy for creating a plasma in the process chamber 200 (e.g. within the cavity 200d of the process chamber 200). A first radio frequency (RF) supply 204 is electrically connected to the electrode 202 and supplies the necessary power to the electrode 202 for a processing operation in the process chamber 200. The first RF supply 204 may include, or may be, an electron cyclotron resonance power supply, an inductively coupled plasma power supply, or a transformer coupled plasma power supply.

The process chamber 200 includes an electrostatic chuck (ESC) 206 that provides support to a substrate that may be placed thereon in a later process step. A second RF supply 208 supplies power to the ESC 206. The ESC 206 may be a second electrode of the process chamber 200. The second RF supply 208 may be a direct current (DC) bias plasma mode RF supply. In an embodiment, a frequency of the RF energy applied by the second RF supply 208 may be in a range from about 10 MHz to about 15 MHz, e.g. about 13 MHz. In another embodiment, the frequency of the RF energy applied by the second RF supply 208 may be in a range from about 200 kHz to about 600 kHz, e.g. about 400 KHz.

The process chamber 200 includes an inlet 209 and a first pump 210 which is in communication with the inlet 209. The first pump 210 and the inlet 209 work in cooperation with each other to introduce or flow fluids (e.g. gases) into the process chamber 200 (e.g. into the cavity 200*d* of the process chamber 200). The process chamber 200 also includes an outlet 212 that enables the evacuation of fluids (e.g. gases) out of the process chamber 200 through a second pump 214.

As described above, a substrate to be processed (e.g. a wafer) may be introduced into the process chamber 200 in a later process step. The substrate inside the process chamber 200 may be exposed to plasmas, process gases (e.g. etchant gases), and thermal cycling. In some processing steps, conditions within the process chamber 200 can be highly aggressive, causing erosion of various chamber components. Examples include processing steps that use a halogen containing plasma. Due to the corrosive nature of plasmas and process gases introduced or formed in the process chamber 200, it is desirable that plasma-exposed components of the process chamber 200 are resistant or made resistant to erosion and corrosion by such gases and plasmas. To this end, the process chamber 200 may include a protective layer 216 lining or coating at least a portion of the inner surface 200*e* of the process chamber 200. In other words, the protective layer 216 may line or coat some of or all the surfaces of the top 200*a*, the base 200*b*, and the sidewalls 200*c* facing the cavity 200*d*. In the example shown in FIG. 2A, the protective layer 216 is formed on the entire extent of the inner surface 200*e* of the process chamber 200. Other elements and/or surfaces within the process chamber 200 (e.g. the surfaces of the ESC 206) may also be lined or coated with the protective layer 216. The coating of other elements and/or surfaces within the process chamber 200 is not shown in FIG. 2A.

The protective layer 216 may include, or may consist of, a material that exhibits high durability in various process chamber environments. In other words, the protective layer 216 may comprise a material that can withstand erosion, etching, or deterioration by plasmas, process gases, and thermal cycling. As an example, the protective layer 216 may include, or may consist of, alumina (e.g. ceramic alumina) or yttria (Y2O3), although other materials may be possible as well. The protective layer 216 may be formed by at least one of a chemical vapor deposition (CVD) process, a physical vapor deposition (PVD) process, a spraying process (e.g. thermal spraying or plasma spraying), and a sintering process, although other suitable processes may be possible as well.

The process chamber 200 may include a quartz containing element 218 disposed in the cavity 200*d* of the process chamber 200. The quartz containing element 218 may, for example, be a part or a tool disposed within the process chamber 200 that is used for a semiconductor manufacturing process. In the example shown in FIG. 2A, the quartz containing element 218 is simplified and shown as a layer that lines a portion of the inner surface 200*e* defined by the top 200*a* and the sidewalls 200*c* of the process chamber 200. The quartz containing element 218 may have an inert surface that does not react with the plasmas and process gases within the process chamber 200. Furthermore, the quartz material (e.g. silicate or SiO2) of the quartz containing element 218 may have high purity characteristics that minimize contamination of the parts and/or tools within the process chamber 200 that could impede wafer processing.

While the quartz material of the quartz containing element 218 may minimize contamination of the process chamber 200, residue from the processing (e.g. etching) that occurs within the process chamber 200 inevitably forms in or on the quartz containing element 218. Over time, the residue and byproducts can cause processes performed within the process chamber 200 to become unreliable, shifted from baseline, and inconsistent from one substrate to the next. For example, over time, the same process performed on the same substrate can have different etch rates, deposition rates, etch depths, critical dimensions, etch profiles, and metal gate resistances, as examples. This may be due to inconsistent conditions within the process chamber 200. Consequently, regular periodic cleaning of the quartz containing element 218 between substrate processing cycles may be necessary to remove the residue and byproducts in an effort to recover chamber conditions.

Even with regular periodic cleaning, conditions within the process chamber 200 can still vary over time. This variation in internal conditions can be caused by the outgassing or release of gaseous byproducts or residues that were previously dissolved, trapped, or adsorbed in or on the quartz containing element 218 during processing of a substrate. The gaseous residues or byproducts released into the cavity 200*d* of the process chamber 200 can result in inconsistent conditions within the process chamber 200, and this can still lead to, e.g., different etch rates, deposition rates, etch depths, critical dimensions, etch profiles, and metal gate resistances for the same process, which can lead to poor uniformity, yield, and performance over identical semiconductor devices. As an example, oxygen may be dissolved, trapped, or adsorbed in or on the quartz containing element 218 during processing of a substrate, and the oxygen can be released from the quartz containing element 218 into the cavity 200*d* of the process chamber 200 over time and adversely affect the etching of substrates within the process chamber 200.

The outgassing of gaseous byproducts or residues may be a result of one or more materials of the quartz containing element 218. For example, the quartz comprised in the quartz containing element 218 may outgas or release the gaseous byproducts or residues into the cavity 200*d* of the process chamber, e.g., as a result of its porosity. The one or more materials of the quartz containing element 218 responsible or capable of outgassing the gaseous byproducts or residues may be referred to as an outgassing material.

Consequently, as shown in FIG. 2B to FIG. 2F, a plurality of barrier layers including a first barrier layer 220 and a second barrier layer 222 may be formed over the quartz containing element 218 (e.g. comprising an outgassing material). The first barrier layer 220 (shown in FIG. 2D) and the second barrier layer 222 (shown in FIG. 2F) inhibit, prevent, or substantially reduce the release or outgassing of gaseous residues or byproducts into the cavity 200*d* of the process chamber 200. This can, in turn, result in consistent internal conditions within the process chamber 200, which consequently can lead to, e.g., consistent etch rates, deposition rates, etch depths, critical dimensions, etch profiles, and metal gate resistances for the same process. This also leads to better uniformity, yield, and performance over identical semiconductor devices.

Figure 2B:
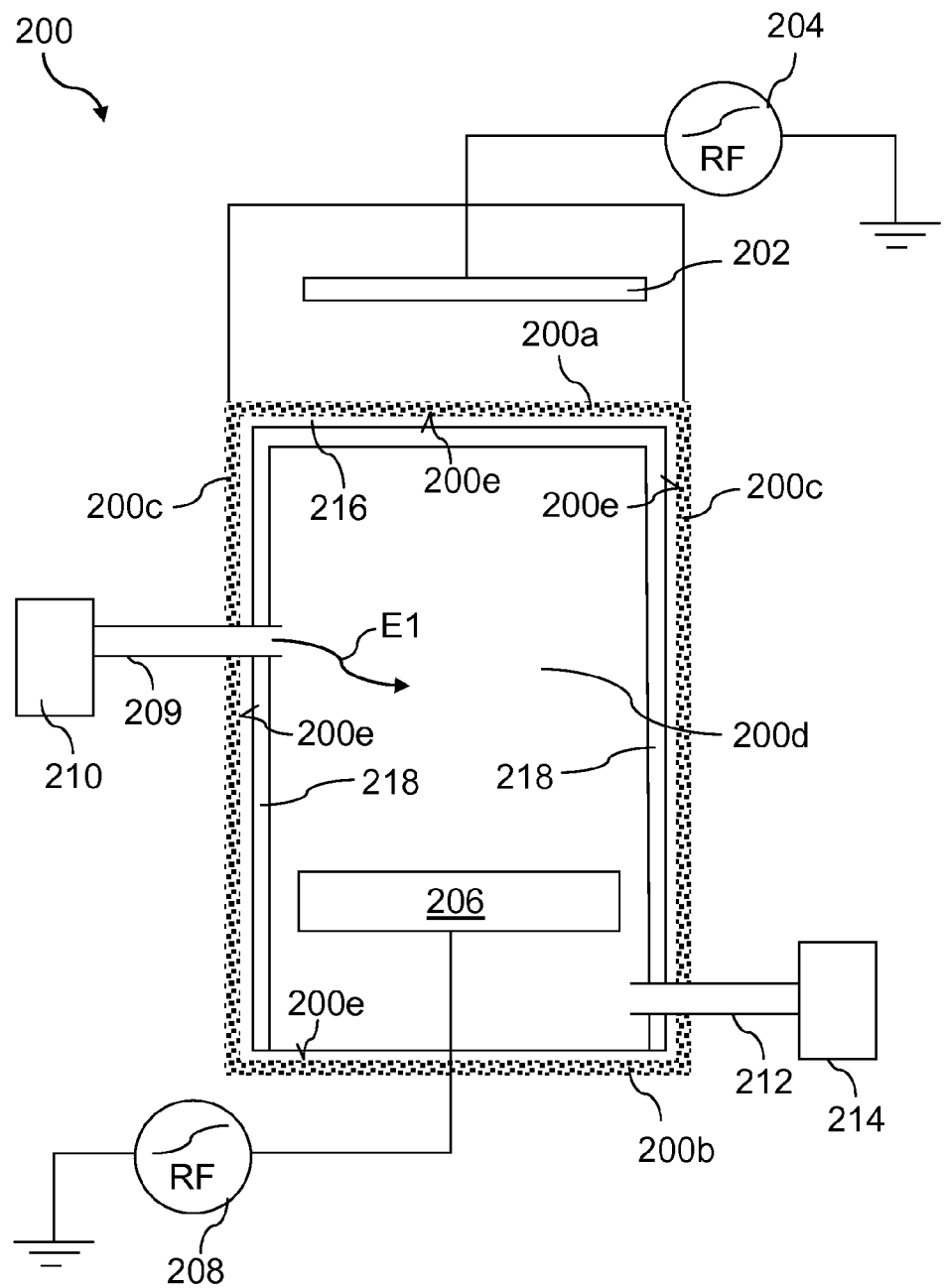

As shown in FIG. 2B, a first etchant gas E1 is flowed into the process chamber 200 through the inlet 209. The first etchant gas E1 serves to treat a surface of the quartz containing element 218 so as to improve adhesion of the first barrier layer 220 (shown in FIG. 2D) to the quartz containing element 218. The surface of the quartz containing element 218 treated by the first etchant gas E1 may, for example, be the surface of the quartz containing element 218 facing the cavity 200d of the process chamber 200. The first etchant gas E1 may partially etch the surface of the quartz containing element 218, thereby roughening the surface. The subsequently formed first barrier layer 220 (shown in FIG. 2D) has better adhesion to the roughened or treated surface of the quartz containing element 218.

In an embodiment, the first etchant gas E1 may include gaseous mixture of a halogen containing gas (e.g. NF3) and an inert gas (e.g. Ar). A flow rate of the halogen containing gas may be in a range from about 600 standard cubic centimeters per minute (sccm) to about 800 sccm, for example about 750 sccm, although other flow rates may be possible as well. A flow rate of the inert gas may be in a range from about 40 sccm to about 80 sccm, for example about 60 sccm, although other flow rates may be possible as well. A pressure of the first etchant gas E1 within the process chamber 200 may be in a range from about 100 millitorrs to about 500 millitorrs, for example, about 300 millitorrs, although other pressures may be possible as well.

In the process step shown in FIG. 2B, an RF voltage may be applied by at least one of the first RF supply 204 and the second RF supply 208, e.g. while the first etchant gas E1 is being flowed into the process chamber 200. The RF voltage may be at a bias power level in a range from about 500 Watts to about 1500 Watts, e.g. about 1000 Watts, although other bias power levels may be possible as well. Following the treating and/or roughening of the surface of the quartz containing element 218, the first etchant gas E1 is evacuated from the process chamber 200 through the outlet 212.

Figure 2C:
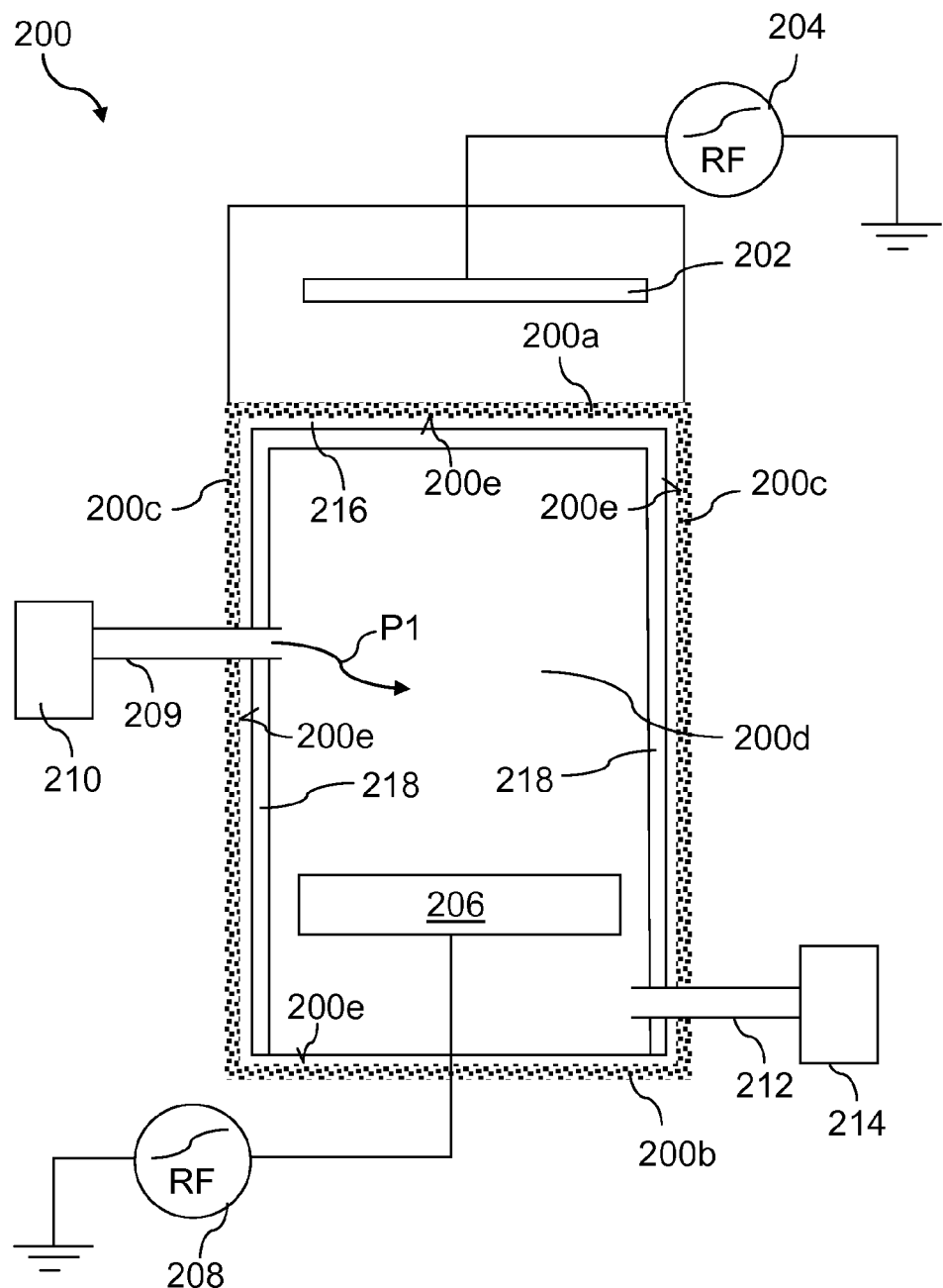

As shown in FIG. 2C, a first process gas P1 is flowed into the process chamber 200 through the inlet 209 after treating the quartz containing element 218. The first process gas P1 provides, among other gases, the source gas for forming the first barrier layer 220 (shown in FIG. 2D). In an embodiment, the first process gas P1 contains silicon and can include a gaseous mixture of a first silicon containing gas (e.g. SiCl4), an inert gas (e.g. Ar), and an oxygen containing gas (e.g. O2). A flow rate of the first silicon containing gas may be in a range from about 150 sccm to about 400 sccm, for example about 250 sccm, although other flow rates may be possible as well. A flow rate of the inert gas may be in a range from about 10 sccm to about 30 sccm, for example about 20 sccm, although other flow rates may be possible as well. A flow rate of the oxygen containing gas may be in a range from about 50 sccm to about 150 sccm, for example about 100 sccm, although other flow rates may be possible as well. A pressure of the first process gas P1 within the process chamber 200 may be in a range from about 20 millitorrs to about 30 millitorrs, for example, about 23 millitorrs, although other pressures may be possible as well.

Figure 2D:
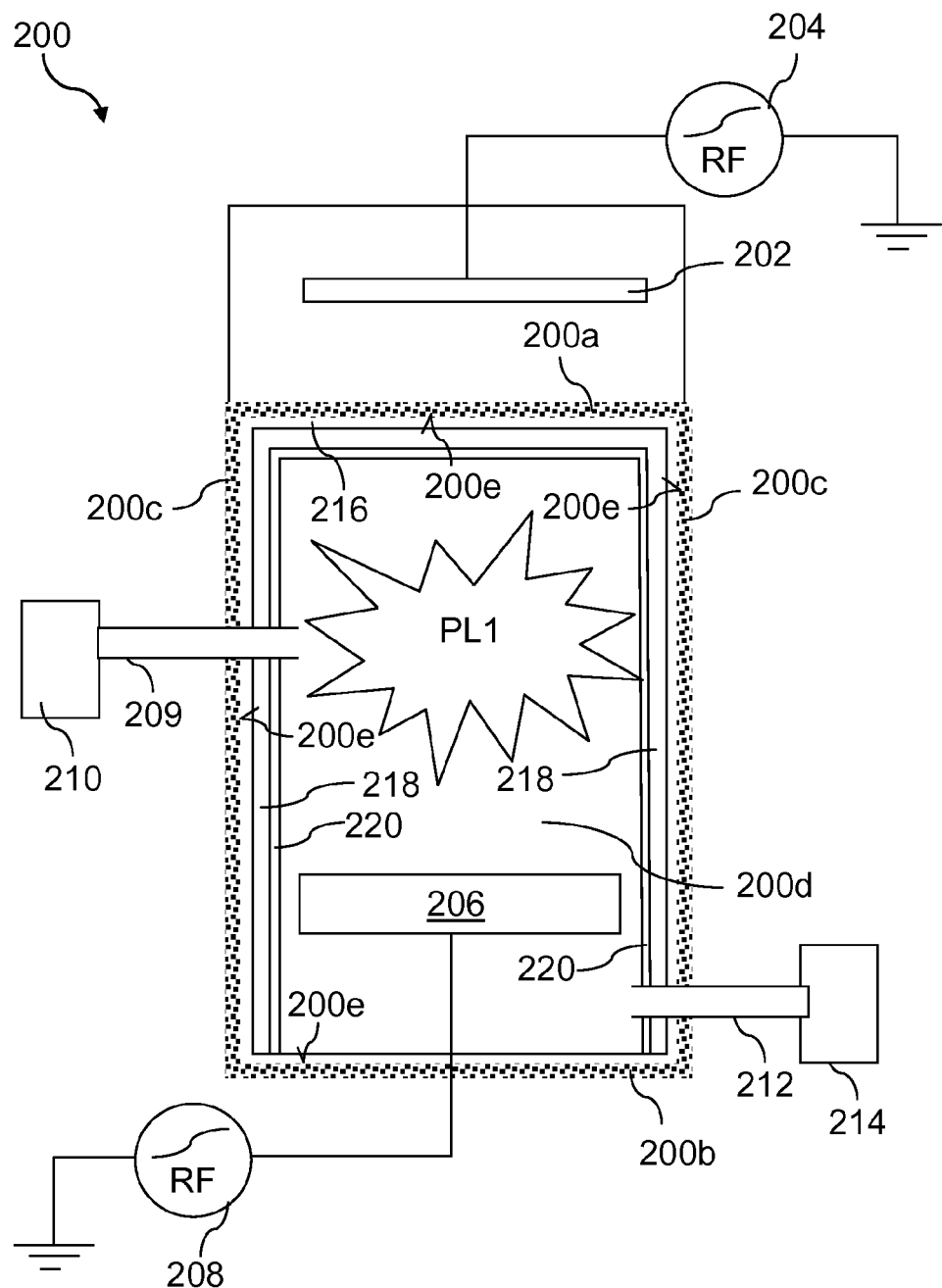

As shown in FIG. 2D, a first plasma PL1 may be created (e.g. ignited) from the first process gas P1, thereby forming the first barrier layer 220 over the quartz containing element 218 (e.g. lining the surfaces of the quartz containing element 218 exposed to the first plasma PL1). Accordingly, forming the first barrier layer 220 may include, or may be, a plasma enhanced chemical vapor deposition (PECVD) process. The first barrier layer 220 may have a thickness in a range from about 0.5 nanometers to about 2.0 nanometers.

The first plasma PL1 may be created from the first process gas P1 by applying a first RF power (e.g. DC RF power) to the ESC 206 of the process chamber 200, e.g. by means of the second RF supply 208. The first RF power may be at a bias power level in a range from about 700 Watts to about 1200 Watts, e.g. about 700 Watts, although other bias power levels may be possible as well.

The first silicon containing gas may be SiCl4, the inert gas may be Ar, and the oxygen containing gas may be O2. In such an example, the chemical reaction for forming the first barrier layer 220 may be expressed as: SiCl4+Ar+ O2→SiClOx+Ar, wherein x is a real number, e.g. a real number greater than or equal to 2 and less than or equal to 4. In this example, the first barrier layer 220 comprises SiClOx. The precise value of x may depend on the gas ratios of the oxygen containing gas (e.g. O2) and the first silicon containing gas SiCl4. In other examples, the silicon containing gas, the inert gas, and the oxygen containing gas may comprise other compounds. Accordingly, in such examples, the first barrier layer 220 can comprise other silicon containing compounds, e.g. SiOy, where y is a real number greater than or equal to 1 and less than or equal to 2. Following the formation of the silicon containing first barrier layer 220, the gaseous byproducts (e.g. Ar) within the process chamber 200 are evacuated from the process chamber 200 through the outlet 212.

Figure 2E:
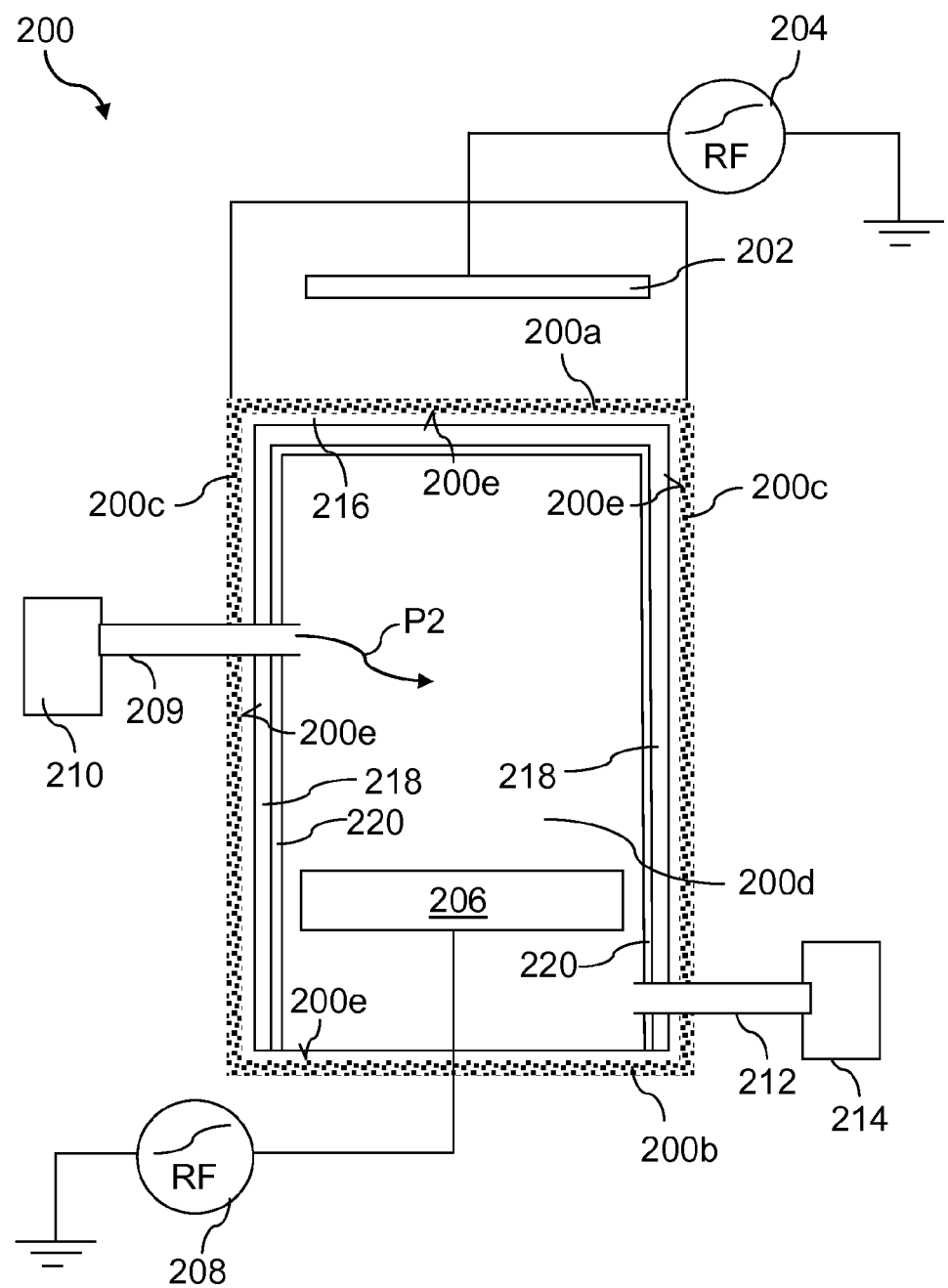

As shown in FIG. 2E, a second process gas P2 is flowed into the process chamber 200 having the first barrier layer 220 through the inlet 209 after the formation of the first barrier layer 220. The second process gas P2 provides, among other gases, the source gas for forming the second barrier layer 222 (shown in FIG. 2F). In an embodiment, the second process gas P2 contains boron and can include a gaseous mixture of a boron containing gas (e.g. BCl3) and a halogen containing gas (e.g. Cl2). The second process gas P2 may additionally include an oxygen containing gas (e.g. O2) or a nitrogen containing gas (e.g. N2) in the gaseous mixture. A flow rate of the boron containing gas may be in a range from about 100 sccm to about 300 sccm, for example about 200 sccm, although other flow rates may be possible as well. A flow rate of the oxygen containing gas or the nitrogen containing gas may be in a range from about 1 sccm to about 10 sccm, for example about 5 sccm, although other flow rates may be possible as well. A flow rate of the halogen containing gas may be in a range from about 1 sccm to about 20 sccm, for example about 10 sccm, although other flow rates may be possible as well. A pressure of the second process gas P2 within the process chamber 200 may be in a range from about 2 millitorrs to about 10 millitorrs, for example, about 5 millitorrs, although other pressures may be possible as well.

Figure 2F:
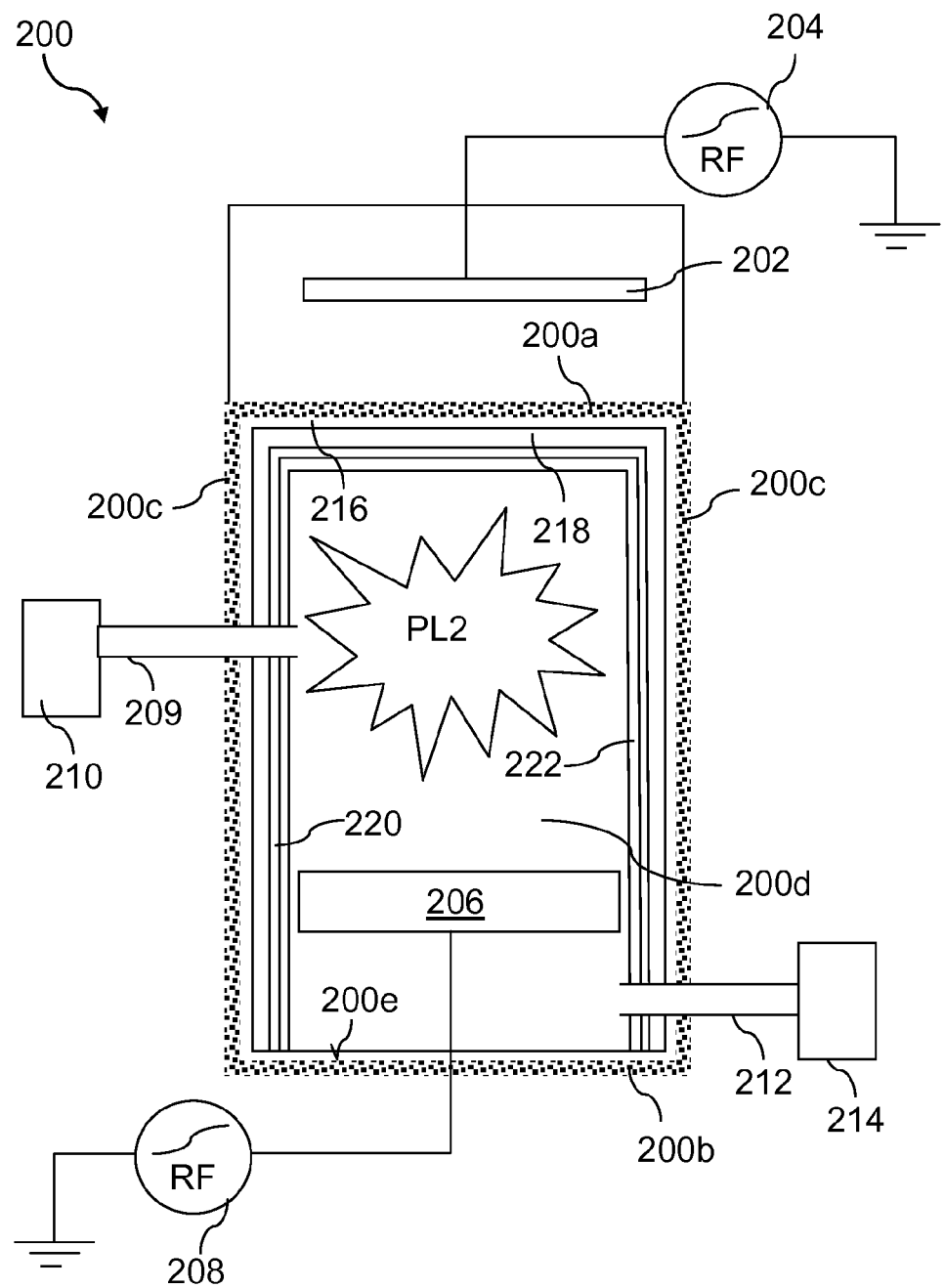

As shown in FIG. 2F, a second plasma PL2 may be created (e.g. ignited) from the second process gas P2, thereby forming the second barrier layer 222 over the first barrier layer 220 (e.g. lining the surfaces of the first barrier layer 220 exposed to the second plasma PL2). Accordingly, forming the second barrier layer 222 may include, or may be, a plasma enhanced chemical vapor deposition (PECVD) process. The second barrier layer 222 may have a thickness in a range from about 1.0 nanometer to about 3.0 nanometers.

The second plasma PL2 may be created from the second process gas P2 by applying a second RF power (e.g. DC RF power) to the ESC 206 of the process chamber 200, e.g. by means of the second RF supply 208. The second RF power may be at a bias power level in a range from about 100 Watts to about 1000 Watts, e.g. about 500 Watts, although other bias power levels may be possible as well. Furthermore, a voltage may be applied by the first RF supply 204 to the electrode 202. The voltage may be in a range from about 5 volts to about 15 volts, e.g. about 10 volts, although other voltages may be possible as well.

The second process gas P2 may include a gaseous mixture of BCl3, Cl2, and O2. In such an example, the chemical reaction for forming the second barrier layer 222 may be expressed as: Si+Cl2+BCl3+O2→SiClOw+SiBOz, wherein w and z are real numbers, e.g. real numbers greater than or equal to 2 and less than or equal to 4. The silicon Si in the chemical reaction may be provided by the silicon containing first barrier layer 220. In the example shown, the second barrier layer 222 comprises SiBOz. The precise value of z may depend on the gas ratios of the boron containing gas BCl3 and the halogen containing gas Cl2. In other examples, the boron containing gas and the halogen containing gas may comprise other compounds. Further, the second process gas P2 may include a nitrogen containing gas instead of an oxygen containing gas. Accordingly, in such examples, the second barrier layer 222 can comprise other boron containing compounds, e.g. SiBNv, where v is a real number greater than or equal to 2 and less than or equal to 4. Following the formation of the boron containing second barrier layer 222, the gaseous byproducts within the process chamber 200 are evacuated from the process chamber 200 through the outlet 212.

The first barrier layer 220 and the second barrier layer 222 inhibit, prevent, or substantially reduce the release or outgassing of gaseous residues or byproducts by the quartz containing element 218 into the cavity 200d of the process chamber 200. This can, in turn, result in consistent internal conditions within the process chamber 200, which consequently can lead to, e.g., consistent etch rates, deposition rates, etch depths, critical dimensions, etch profiles, and metal gate resistances for the same process. This also leads to better uniformity, yield, and performance over identical semiconductor devices. Furthermore, any deterioration of the second barrier layer 222 and/or the first barrier layer 220 can be easily detected by optical emission spectroscopy (OES) or atomic emission spectroscopy (AES), as examples. Accordingly, an OES or AES signal may be used to indicate, at an early stage, whether the internal conditions of the process chamber 200 have changed, e.g. due to outgassing of gaseous residues or byproducts by the quartz containing element 218.

Figure 3:
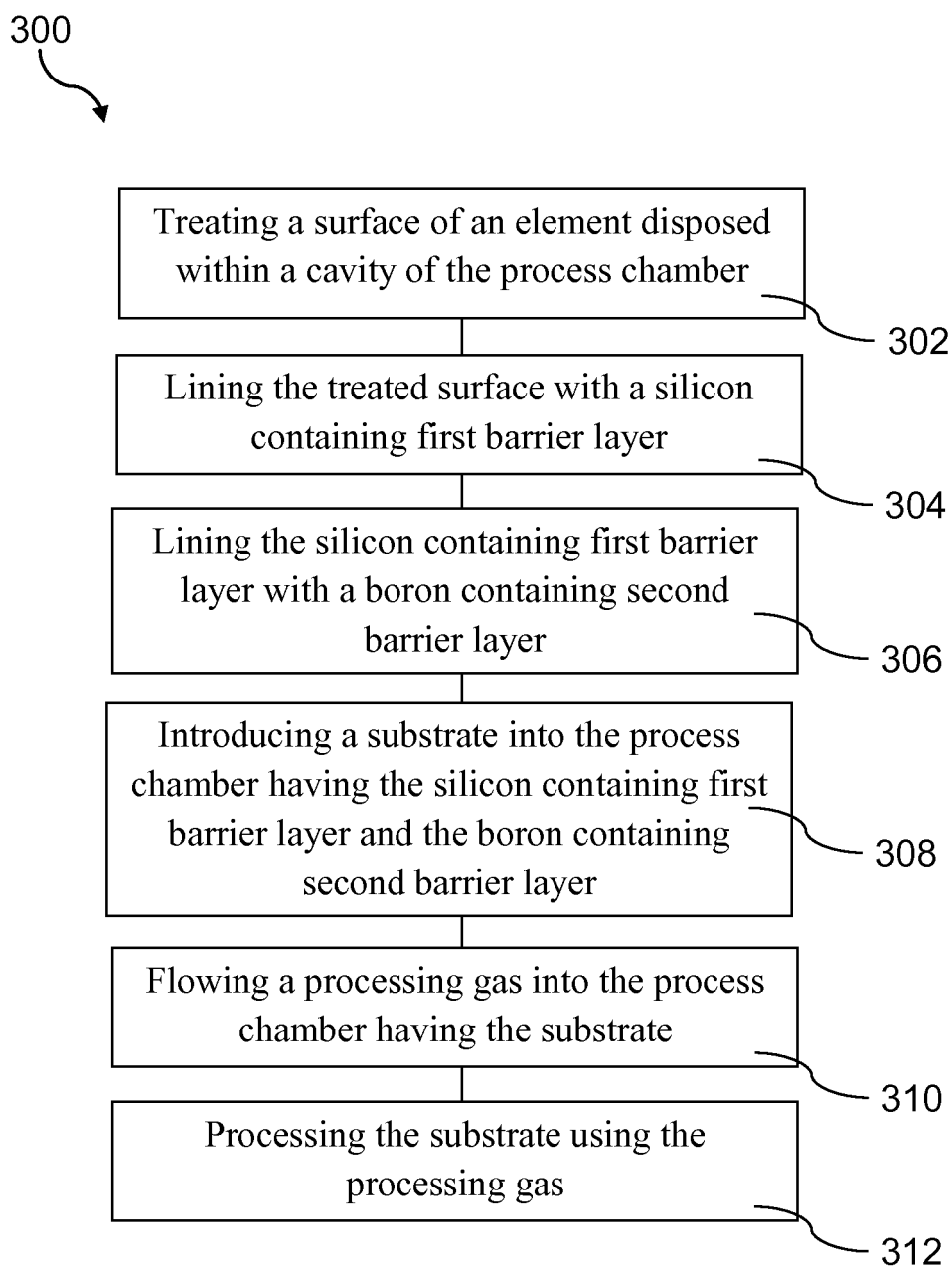
FIG. 3 shows a method for operating a process chamber, in accordance with some embodiments.

FIG. 3 shows a method 300 for operating a process chamber, in accordance with one or more embodiments. The method 300 may include: treating a surface of an outgassing element disposed within a cavity of the process chamber (in 302); lining the treated surface with a silicon containing first barrier layer (in 304); lining the silicon containing first barrier layer with a boron containing second barrier layer (in 306); introducing a substrate into the process chamber having the silicon containing first barrier layer and the boron containing second barrier layer (in 308); flowing a processing gas into the process chamber having the substrate (in 310); and processing the substrate using the processing gas (in 312).

Figure 4A:
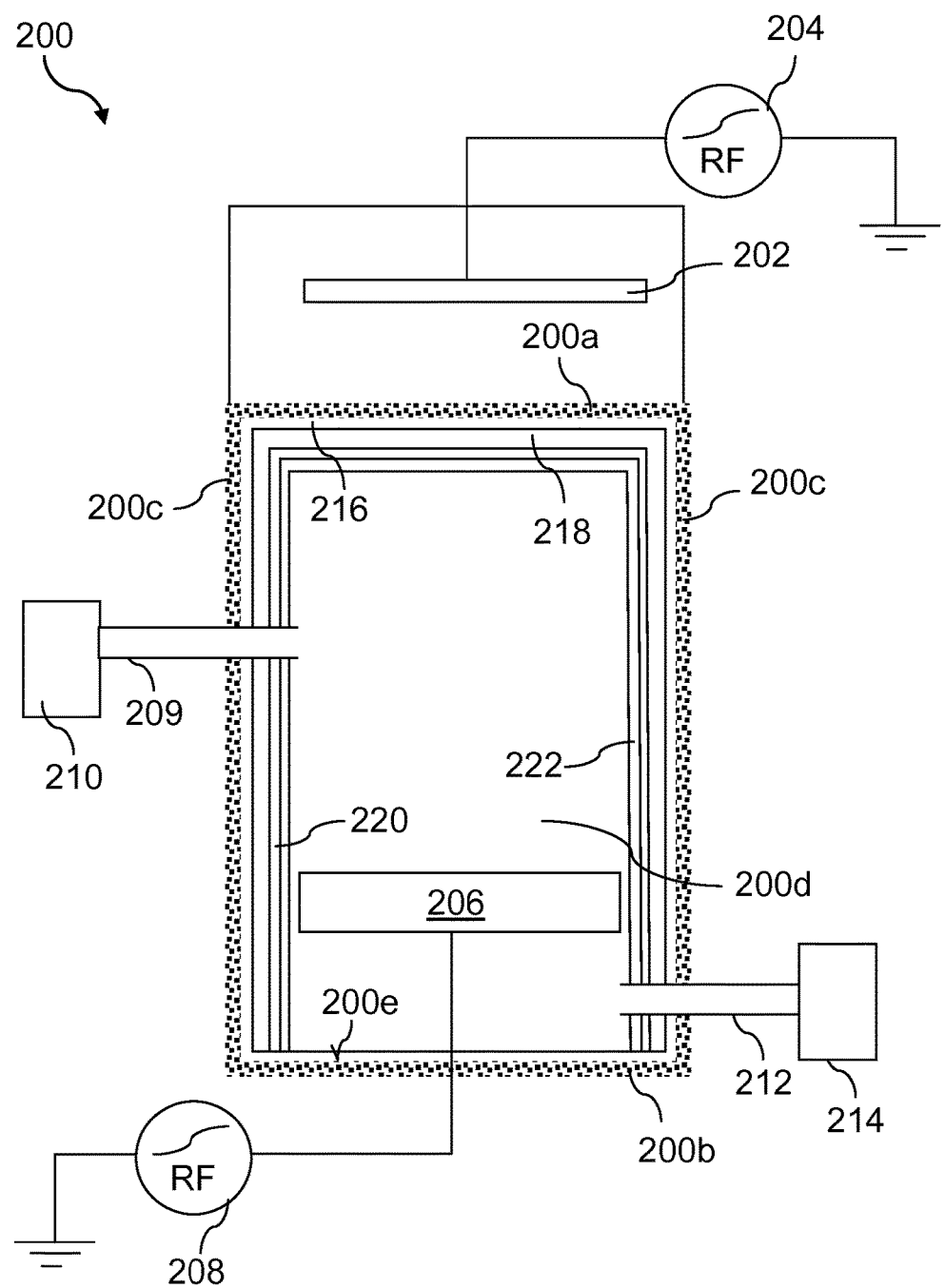
FIG. 4A to FIG. 4D show a process flow illustrating some of the process steps of the method shown in FIG. 3.

FIG. 4A to FIG. 4D show a process flow illustrating some of the process steps of the method 300 shown in FIG. 3, in accordance with one or more embodiments. FIG. 4A shows the silicon containing first barrier layer 220 and the boron containing second barrier layer 222 formed on the quartz containing element 218. The arrangement shown in FIG. 4A may, for example, be obtained by the process flow illustrated in FIG. 2A to FIG. 2F.

Figure 4B:
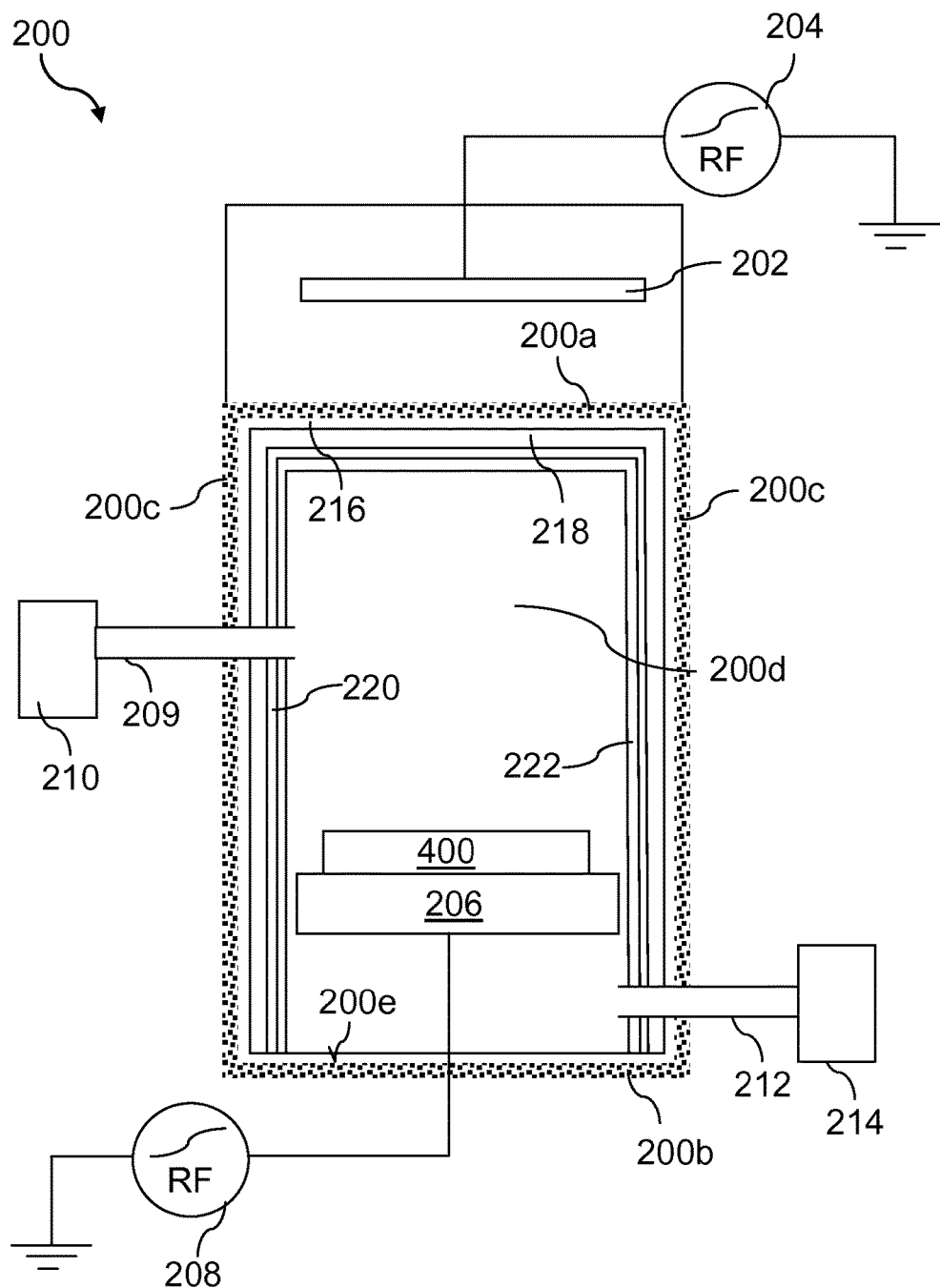

As shown in FIG. 4B, a substrate 400 (e.g. a wafer) may be introduced into the process chamber 200 having the silicon containing first barrier layer 220 and the boron containing second barrier layer 222. The substrate 400 may be placed on the ESC 206, and may be held in place by an electrostatic force exerted by the ESC 206 on the substrate 400. The substrate 400 may include at least one of a polysilicon layer, a metal layer, a dielectric layer, and a semiconductor layer for processing within the process chamber 200.

Figure 4C:
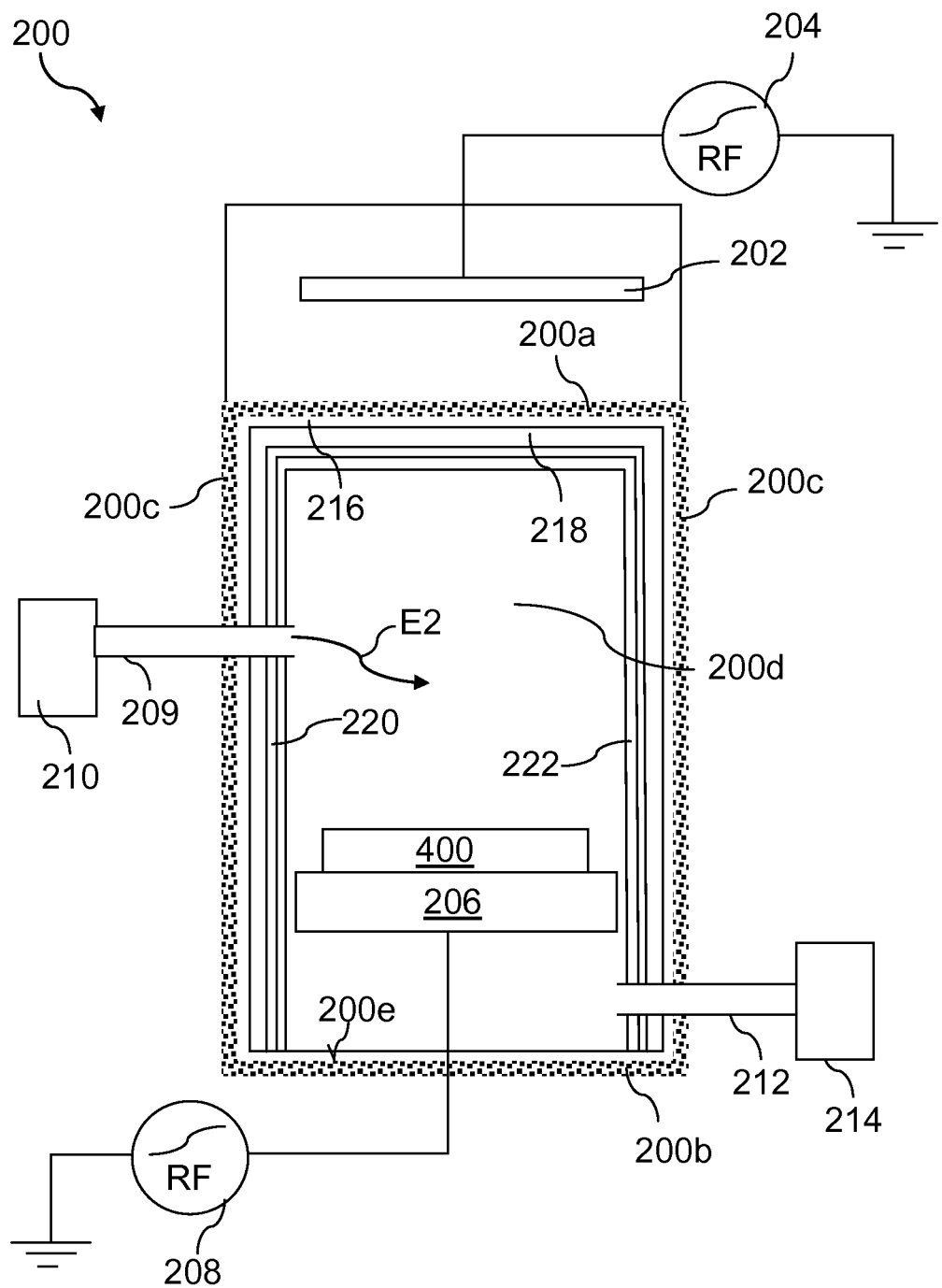

As shown in FIG. 4C, a processing gas E2 is flowed into the process chamber 200 through the inlet 209. The processing gas E2 is flowed into the process chamber 200 for a sufficient amount of time to uniformly fill the process chamber 200. For example, the processing gas E2 may be flowed into the process chamber 200 for duration of time lasting from about 25 seconds to about 30 seconds. This may be a sufficient amount of time to also establish a uniform processing gas pressure within the process chamber 200.

In an embodiment, the processing gas E2 may include, or may be, an etchant gas, e.g. for an etching process. In another embodiment, the processing gas E2 may include, or may be, a source gas, e.g. for a deposition process. In yet another embodiment, the processing gas E2 may include, or may be, a gas for another semiconductor manufacturing process. The description that follows describes the processing gas E2 in the context of an etching process. However, this is solely for the sake of illustration and not meant to be limiting.

Figure 4D:
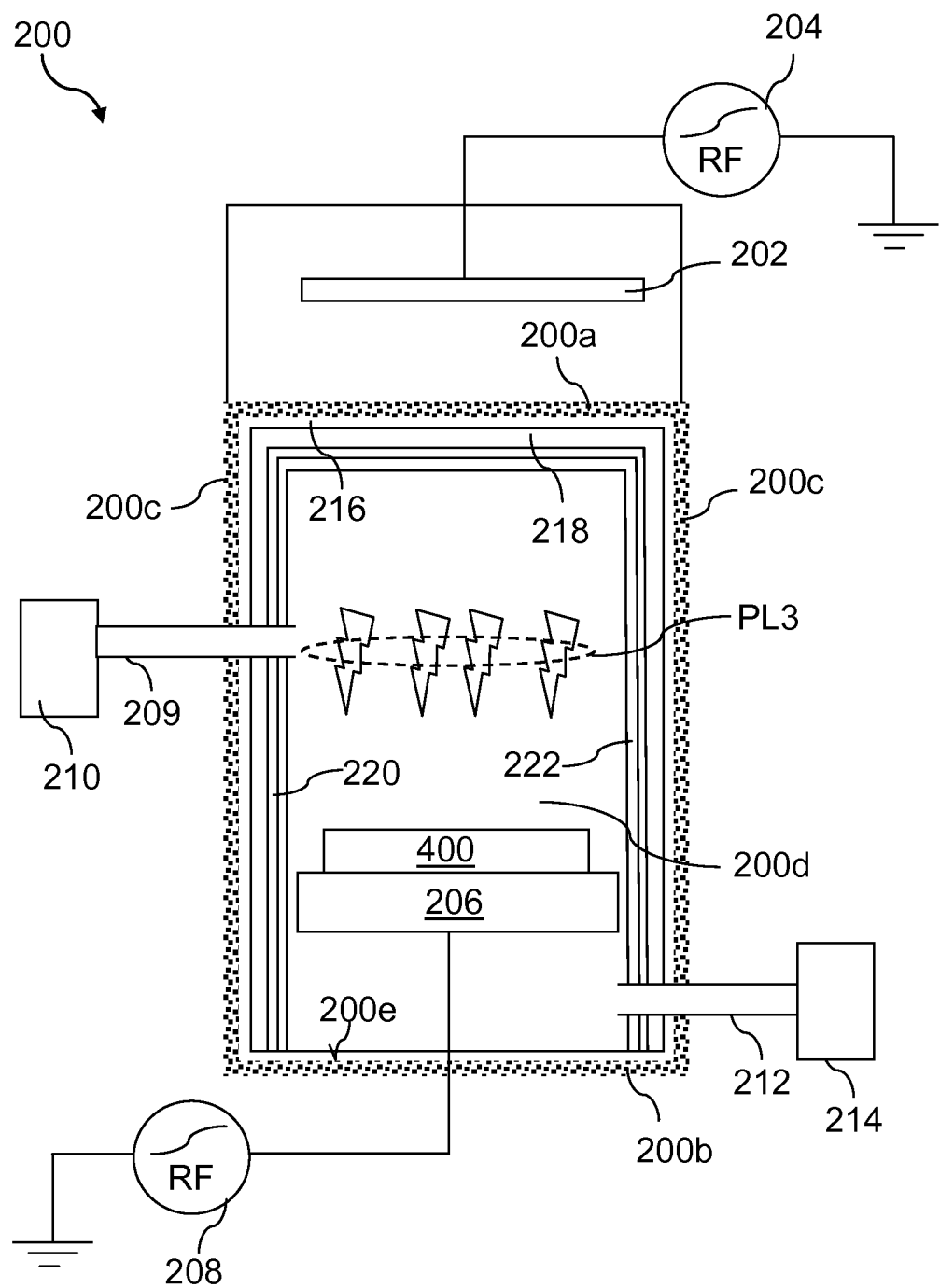

As shown in FIG. 4D, an etching plasma PL3 may be created from the processing gas E2, e.g. by a voltage applied by the first RF supply 204 to the electrode 202. The voltage may be in a range from about 5 volts to about 15 volts, e.g. about 10 volts, although other voltages may be possible as well. The etching plasma PL3 serves to etch the substrate 400. For example, at least one of the polysilicon layer, the metal layer, the dielectric layer, and the semiconductor layer of the substrate 400 may be etched by means of the etching plasma PL3.

The first barrier layer 220 and the second barrier layer 222 inhibit, prevent, or substantially reduce the release or outgassing of gaseous residues or byproducts by the quartz containing element 218 into the cavity 200d of the process chamber 200. This can, in turn, result in consistent internal conditions within the process chamber 200, which consequently can lead to, e.g., consistent etch rates, deposition rates, etch depths, critical dimensions, etch profiles, and metal gate resistances for the same etching process applied to other substrates that may be identical to the substrate 400. This also leads to better uniformity, yield, and performance over identical semiconductor devices that may be manufactured. Furthermore, any deterioration of the second barrier layer 222 and/or the first barrier layer 220 can be easily detected by optical emission spectroscopy (OES) or atomic emission spectroscopy (AES), as examples. Accordingly, an OES or AES signal may be used to indicate, at an early stage, whether the internal conditions of the process chamber 200 have changed, e.g. due to outgassing of gaseous residues or byproducts by the quartz containing element 218.

According to various embodiments presented herein, a method of preparing a process chamber for processing a substrate may be provided. The method may include: forming a first barrier layer over an element disposed within a cavity of the process chamber, the element comprising an outgassing material; and forming, within the process chamber, a second barrier layer over the first barrier layer.

According to various embodiments presented herein, a method of preparing a process chamber for processing a substrate may be provided. The method may include: treating a surface of a quartz containing element disposed within a cavity of the process chamber to form a treated surface; forming a silicon containing first barrier layer over the treated surface of the quartz containing element; and forming a boron containing second barrier layer over the silicon containing first barrier layer.

According to various embodiments presented herein, a method of operating a process chamber may be provided. The method may include: treating a surface of an element disposed within a cavity of the process chamber to form a treated surface; lining the treated surface with a silicon containing first barrier layer; lining the silicon containing first barrier layer with a boron containing second barrier layer; introducing a substrate into the process chamber having the silicon containing first barrier layer and the boron containing second barrier layer; flowing a processing gas into the process chamber having the substrate; and processing the substrate using the processing gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of preparing a process chamber for processing a substrate, the method comprising:
    forming a first barrier layer comprising silicon over an element disposed within a cavity of the process chamber, the element comprising an outgassing material; and
    forming, within the process chamber, a second barrier layer comprising boron over the first barrier layer, the second barrier layer formed by reaction with silicon of the first barrier layer.

2. The method of claim 1, wherein the forming the first barrier layer comprises:
    flowing a first process gas containing silicon into the process chamber; and
    creating a first plasma from the first process gas containing silicon by applying a first radiofrequency power to an electrode of the process chamber.

3. The method of claim 2, wherein the first process gas containing silicon comprises a gaseous mixture of a first silicon containing gas, an inert gas, and an oxygen containing gas.

4. The method of claim 2, wherein a pressure of the first process gas containing silicon within the process chamber is in a range from about 20 millitorrs to about 30 millitorrs.

5. The method of claim 1, wherein the forming the second barrier layer comprises:
    flowing a second process gas containing boron into the process chamber; and
    creating a second plasma from the second process gas containing boron by applying a second radiofrequency power to an electrode of the process chamber.

6. The method of claim 5, wherein the second process gas containing boron comprises a gaseous mixture of a boron containing gas and a halogen containing gas.

7. The method of claim 6, wherein the gaseous mixture further comprises an oxygen containing gas or a nitrogen containing gas.

8. The method of claim 5, wherein a pressure of the second process gas containing boron within the process chamber is in a range from about 2 millitorrs to about 10 millitorrs.

9. The method of claim 1, wherein the forming the first barrier layer comprises:
    roughening a surface of the element to form a roughened surface; and
    depositing the first barrier layer over the roughened surface of the element.

10. A method of preparing a process chamber for processing a substrate, the method comprising:
    treating a surface of a quartz containing element disposed within a cavity of the process chamber to form a treated surface of the quartz containing element;
    forming a silicon containing first barrier layer over the treated surface of the quartz containing element; and
    forming a boron containing second barrier layer over the silicon containing first barrier layer, wherein the boron containing second barrier layer comprises silicon of the silicon containing first barrier layer.

11. The method of claim 10, wherein the treating the surface of the quartz containing element comprises roughening the surface of the quartz containing element.

12. The method of claim 11, wherein the roughening the surface of the quartz containing element comprises partially etching the surface of the quartz containing element.

13. The method of claim 10, wherein the forming the boron containing second barrier layer over the silicon containing first barrier layer comprises a plasma enhanced chemical vapor deposition process including a boron containing plasma.

14. The method of claim 10, wherein the boron containing second barrier layer comprises $SiBO_x$, where x is real number greater than or equal to two and less than or equal to four.

15. The method of claim 10, wherein the boron containing second barrier layer further contains oxygen or nitrogen.

16. A method of operating a process chamber, the method comprising:
    treating a surface of an outgassing element disposed within a cavity of the process chamber to form a treated surface;
    lining the treated surface with a silicon containing first barrier layer;
    lining the silicon containing first barrier layer with a boron containing second barrier layer, wherein the boron containing second barrier layer comprises silicon of the silicon containing first barrier layer;
    introducing a substrate into the process chamber having the silicon containing first barrier layer and the boron containing second barrier layer;
    flowing a processing gas into the process chamber having the substrate; and
    processing the substrate using the processing gas.

17. The method of claim 16, wherein the processing the substrate using the processing gas comprises etching the substrate using the processing gas.

18. The method of claim 16, wherein the flowing the processing gas into the process chamber having the substrate comprises uniformly filling the process chamber with the processing gas, establishing a uniform processing gas pressure within the process chamber.

19. The method of claim 16, wherein the lining the silicon containing first barrier layer with the boron containing second barrier layer comprises:

flowing a gaseous mixture containing boron and a halogen into the process chamber; and forming a boron containing plasma from the gaseous mixture.

20. The method of claim 19, wherein the gaseous mixture further contains one of oxygen and nitrogen.

* * * * *